United States Patent
Küçükçakar et al.

(10) Patent No.: US 7,237,212 B2
(45) Date of Patent: Jun. 26, 2007

(54) METHOD AND APPARATUS FOR REDUCING TIMING PESSIMISM DURING STATIC TIMING ANALYSIS

(75) Inventors: Kayhan Küçükçakar, Sunnyvale, CA (US); Ali Dasdan, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 65 days.

(21) Appl. No.: 10/972,899

(22) Filed: Oct. 22, 2004

(65) Prior Publication Data

US 2006/0090150 A1    Apr. 27, 2006

(51) Int. Cl.
*G06F 17/50* (2006.01)
(52) U.S. Cl. ......................................................... 716/6
(58) Field of Classification Search .................... 716/4, 716/6, 12; 702/69, 108; 703/2, 19
See application file for complete search history.

(56) References Cited

U.S. PATENT DOCUMENTS 5,845,233 A * 12/1998 Fishburn ..................... 702/108
2003/0182098 A1 * 9/2003 Ehrler .......................... 703/19
2004/0167756 A1 * 8/2004 Yonezawa ...................... 703/2
2004/0243964 A1 * 12/2004 McElvain et al. ............. 716/12
2004/0261044 A1 * 12/2004 Yonezawa ....................... 716/4
2005/0050496 A1 * 3/2005 Kovacs et al. .................. 716/6
2005/0066297 A1 * 3/2005 Kalafala et al. ................ 716/6
2005/0246117 A1 * 11/2005 Hathaway et al. ............ 702/69

* cited by examiner

*Primary Examiner*—Leigh M. Garbowski
(74) *Attorney, Agent, or Firm*—Park, Vaughan & Fleming LLP (57) ABSTRACT

One embodiment of the present invention provides a system that reduces timing pessimism during Static Timing Analysis (STA). During operation, the system receives parametric variation data which describes the on-chip variation of timing-related parameters. Next, the system computes region-specific derating factors using the parametric variation data. The system then identifies a set of worst-case violating paths using the region-specific derating factors. Next, the system computes path-specific derating factors for one or more paths in the set of worst-case violating paths using the parametric variation data and the path properties. Finally, the system identifies zero or more realistic-case violating paths from the set of worst-case violating paths using the path-specific derating factors.

27 Claims, 7 Drawing Sheets

METHOD AND APPARATUS FOR REDUCING TIMING PESSIMISM DURING STATIC TIMING ANALYSIS

BACKGROUND

1. Field of the Invention

This invention relates to the process of verifying timing constraints in an integrated circuit. More specifically, this invention relates to the process of reducing timing pessimism during static timing analysis.

2. Related Art

Rapid advances in computing technology have made it possible to perform trillions of computational operations each second on data sets that are sometimes as large as trillions of bytes. These advances can be largely attributed to the exponential increase in the size and complexity of integrated circuits.

Due to the increase in size and complexity of integrated circuits, it has become necessary to use sophisticated tools to verify timing constraints.

Before the advent of Static Timing Analysis (STA), timing constraints were typically verified using simulation-based techniques. As the complexity of integrated circuits grew, using simulation-based techniques to verify timing constraints became impractical because of their long runtimes, low capacities, and incomplete analyses.

Unlike simulation-based techniques, STA verifies timing by computing the worst-case delays without enumerating all possible paths. Because of this, STA can perform a thorough timing analysis for large integrated circuits within a reasonable amount of time. As a result, STA has emerged as the method of choice for verifying timing constraints for large integrated circuits.

A number of factors must be considered while performing STA. The design and fabrication of integrated circuits involve complex physical and chemical processes, which cause on-chip variation of timing-related parameters. Typically, STA techniques model this on-chip variation using a global derating factor, which is used to change (or derate) delays to reflect on-chip variation. Since a global derating factor is globally applied to every delay, it ignores the context or location where each delay occurs.

Consequently, present STA techniques usually solve for the worst case scenario for on-chip variation, which typically results in a safe but pessimistic timing analysis.

Unfortunately, due to the continuing miniaturization of feature sizes, timing constraints for integrated circuits are becoming increasingly stringent. As a result, it is becoming extremely difficult to design integrated circuits using present STA techniques due to their overly pessimistic timing analyses.

Hence, what is needed is a method and apparatus that reduces timing pessimism during STA without significantly increasing the computational time.

SUMMARY

One embodiment of the present invention provides a system that reduces timing pessimism during Static Timing Analysis (STA). During operation, the system receives parametric variation data which describe the on-chip variation of timing-related parameters. Next, the system computes region-specific derating factors using the parametric variation data. The system then identifies a set of worst-case violating paths using the region-specific derating factors. Next, the system computes path-specific derating factors for one or more paths in the set of worst-case violating paths using the region-specific derating factors as well as the properties of the paths themselves (e.g., distances between their cells, path lengths, etc.). Finally, the system identifies zero or more realistic-case violating paths from the set of worst-case violating paths using the path-specific derating factors. Note that the timing pessimism is reduced because the system identifies realistic-case violating paths using the fine-grained path-specific derating factors instead of using the coarse-grained region-specific derating factors. Moreover, the system saves computational time by first identifying a set of worst-case violating paths and then identifying the realistic-case violating paths from the set of worst-case violating paths, instead of directly identifying the realistic-case violating paths from the set of all possible paths.

In a variation on this embodiment, a parameter in the parametric variation data can be a distance-independent parameter, or a distance-dependent parameter.

In a variation on this embodiment, computing region-specific derating factors involves computing a global derating factor.

In a variation on this embodiment, the system computes path-specific derating factors by identifying a reference-path, which is used as a reference while computing the delays for other paths.

In a variation on this embodiment, the system computes path-specific derating factors by first receiving a set of user-specified instructions. The system then computes the path-specific derating factors using the set of user-specified instructions.

In a variation on this embodiment, the system computes path-specific derating factors by computing a bounding box, which encloses all the paths that are being analyzed.

In a variation on this embodiment, the system computes path-specific derating factors by computing a distance between two cells within the chip. Note that the distance can be a electrical distance, a topological distance, or a layout distance.

DETAILED DESCRIPTION

Static Timing Analysis

Figure 1:
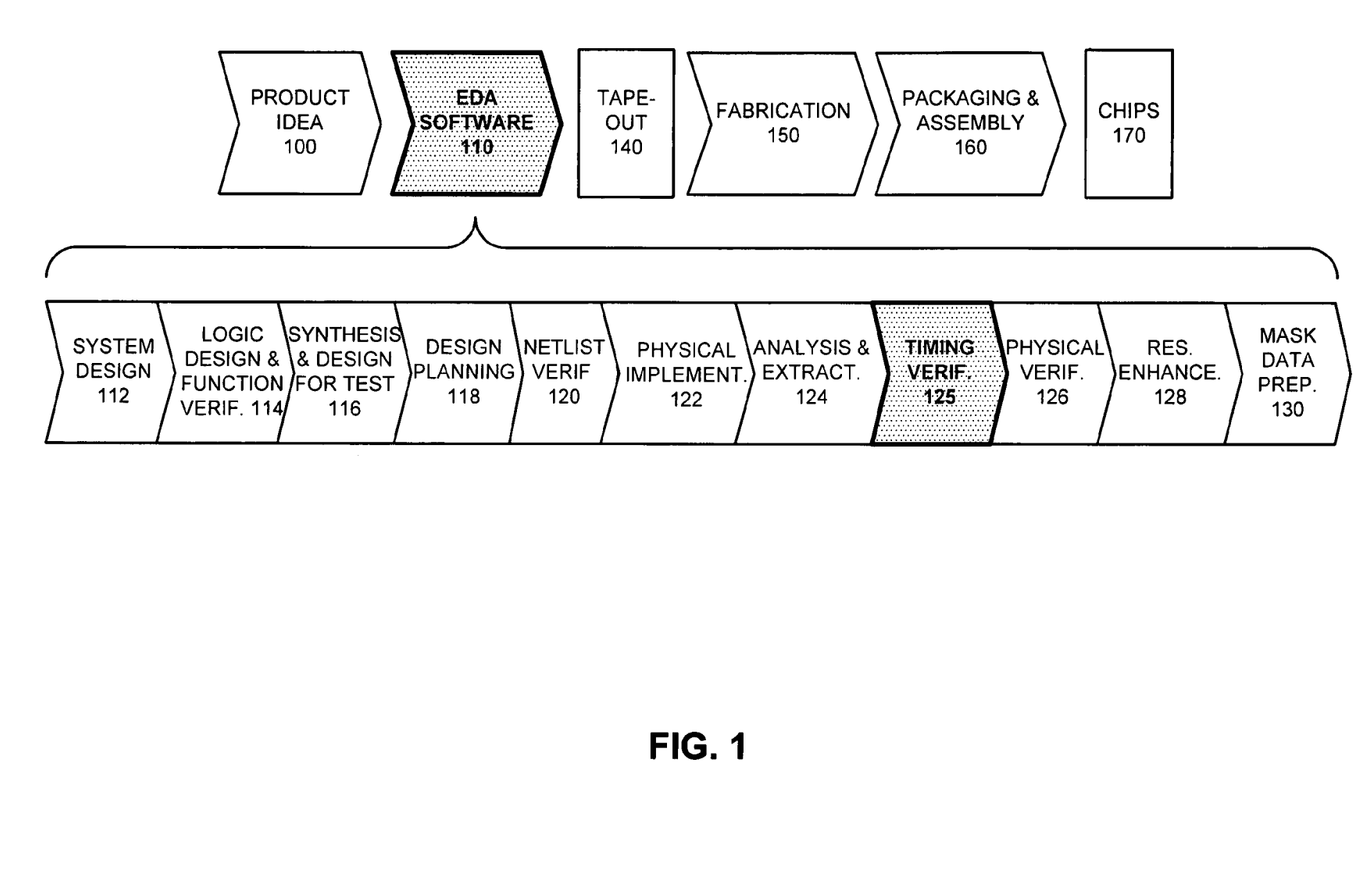
FIG. 1 illustrates the various steps in the design and fabrication of an integrated circuit in accordance with an embodiment of the present invention.

FIG. 1 illustrates the various steps in the design and fabrication of an integrated circuit in accordance with an embodiment of the present invention. The process starts with a product idea (step 100). Next, the product idea is realized by an integrated circuit, which designed using Electronic Design Automation (EDA) software (step 110). Once the design is finalized in software, it is taped-out (step 140). After tape-out, the process goes through fabrication (step 150), packaging, and assembly (step 160). The process eventually culminates with the production of chips (step 170).

The EDA software design step 110, in turn, includes a number of sub-steps, namely, system design (step 112), logic design and function verification (step 114), synthesis and design for test (step 116), design planning (step 118), netlist verification (step 120), physical implementation (step 122), analysis and extraction (step 124), timing verification (step 125), physical verification (step 126), resolution enhancement (step 128), and mask data preparation (step 130).

Static Timing Analysis (STA) typically takes place during the timing verification step 125, in which the netlist is checked for compliance with timing constraints and for correspondence with the VHDL/Verilog source code. Note that the PrimeTime® product from Synopsys, Inc. can be used for STA.

Before the advent of STA, timing was typically verified using simulation-based techniques. Unfortunately, as the complexity of integrated circuits grew, using simulation-based techniques to verify timing constraints became impractical because of their long runtimes, low capacities, and incomplete analyses.

Unlike simulation-based techniques, STA verifies timing by computing the worst-case and best-case delays without enumerating all possible paths. Because of this, STA can perform a thorough timing analysis for large integrated circuits within a reasonable amount of time. As a result, STA has emerged as the method of choice for performing timing verification for large integrated circuits.

Figure 2:
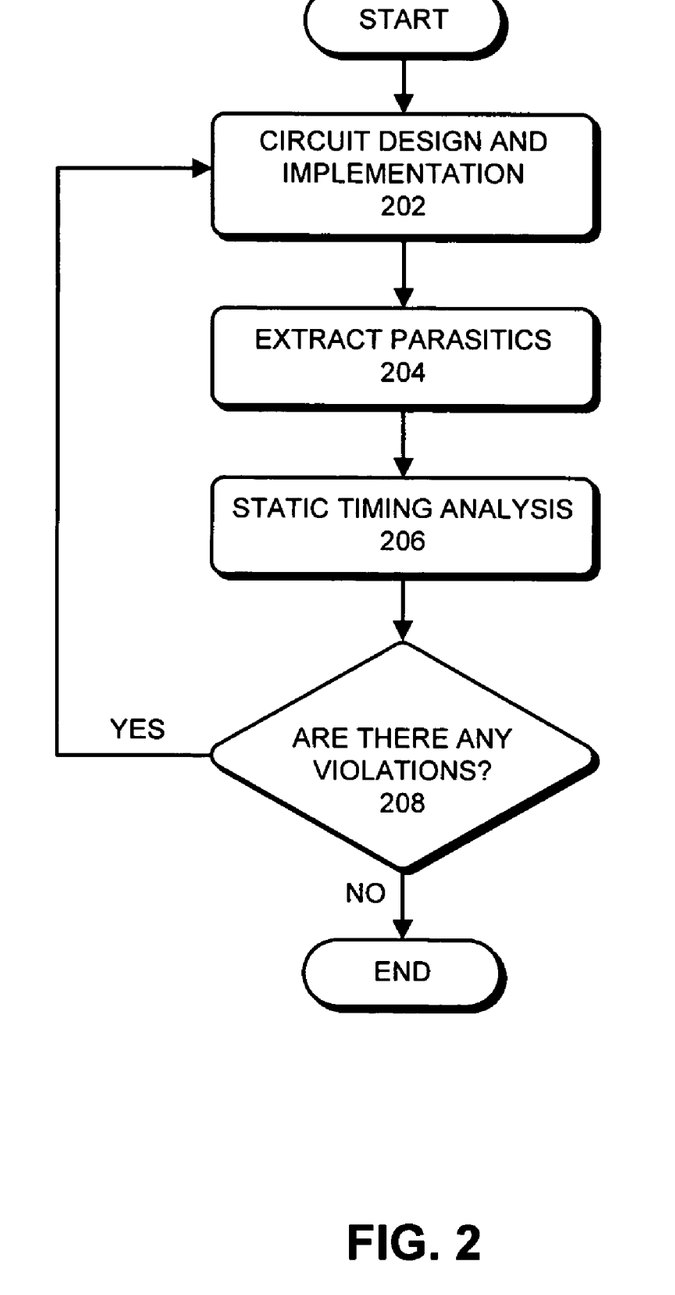
FIG. 2 presents a flowchart that illustrates how STA is typically used during the design and implementation of integrated circuits in accordance with an embodiment of the present invention.

FIG. 2 presents a flowchart that illustrates how STA is typically used during the design and implementation of integrated circuits in accordance with an embodiment of the present invention.

First an integrated circuit is designed (step 202). Next, the parasitics are extracted (step 204). Static timing analysis is then performed (step 206). If timing violations are found (step 208), the process goes back to the circuit design step 202, so that the circuit can be tweaked to fix the timing violations. On the other hand, if no timing violations are found, the process continues to the next step in the fabrication process.

Location-Aware On-Chip Variation

Figure 3:
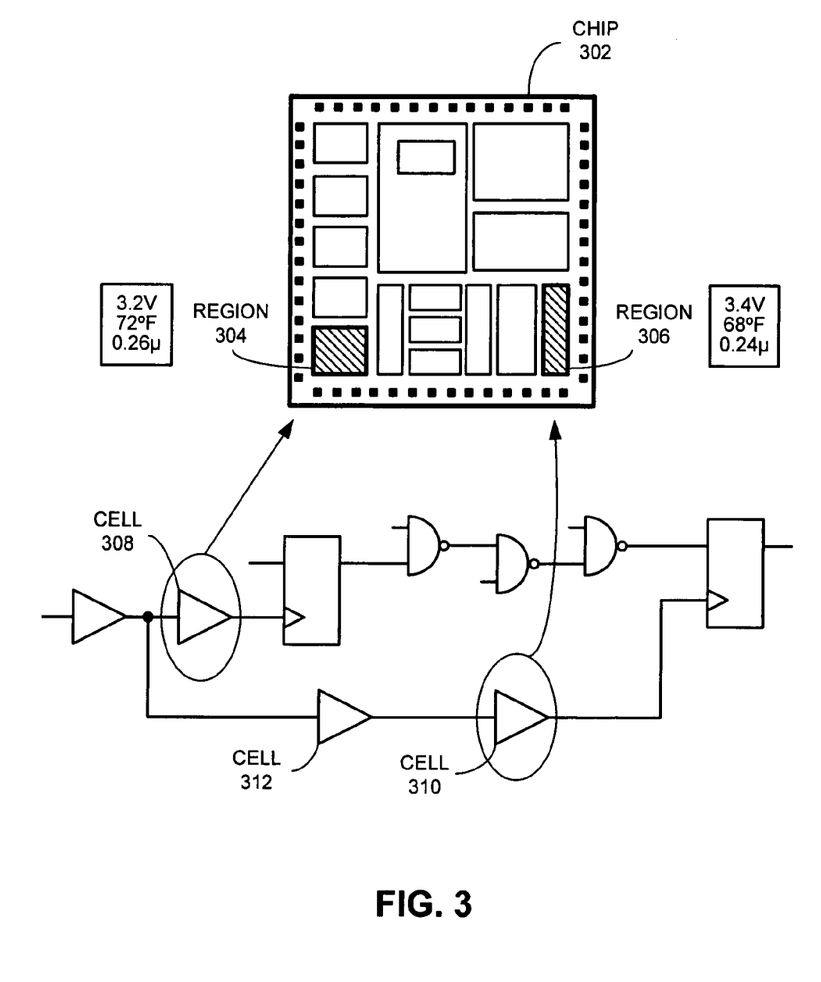
FIG. 3 illustrates on-chip variation of timing-related parameters in accordance with an embodiment of the present invention.

FIG. 3 illustrates on-chip variation of timing-related parameters in accordance with an embodiment of the present invention.

The design and fabrication of integrated circuits involve complex physical and chemical processes, which cause on-chip variation of timing-related parameters. For example, the voltage, temperature, and process parameters (e.g., channel length) can vary over the chip 302. Specifically, the voltage, temperature, and process parameters in region 304 can be 3.2V, 72° F., and 0.26μ, respectively. Likewise, the voltage, temperature, and process parameters in region 306 can be 3.4V, 68° F., and 0.24μ, respectively.

Due to on-chip variation, a cell in region 304, such as cell 308, can have a different delay from a cell in region 306, such as cell 310, even if the designer intended them to be identical. In one embodiment of the present invention, on-chip variation can be modeled using multiple cell libraries.

Figure 4:
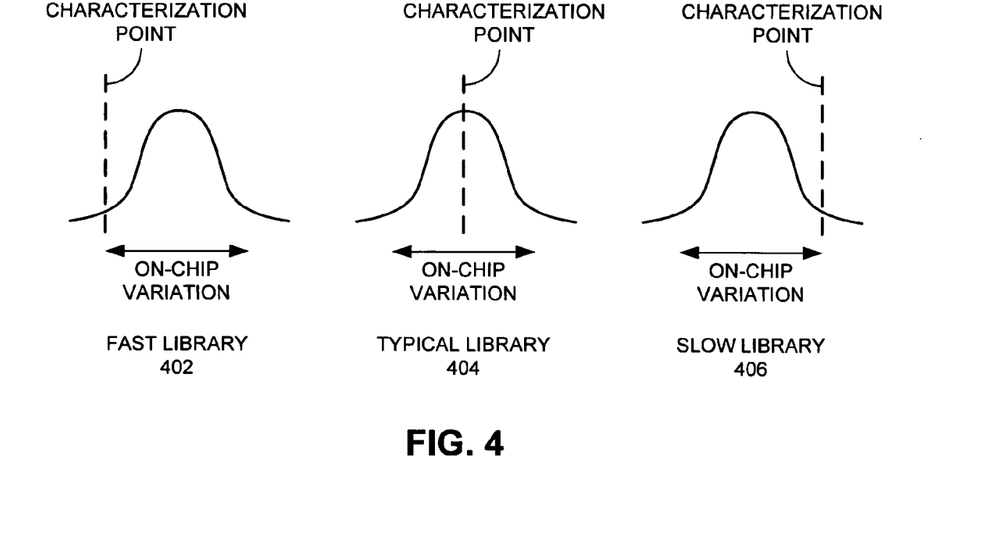
FIG. 4 illustrates the distribution of the on-chip variation and the characterization point for three libraries in accordance with an embodiment of the present invention.

For example, FIG. 4 illustrates the distribution of the on-chip variation and the characterization point for three libraries, namely, a fast library 402, a typical library 404, and a slow library 406 in accordance with an embodiment of the present invention.

STA typically uses derating factors to model on-chip variation. Note that present STA techniques typically use a global derating factor, which is not sensitive to the context or location. This results in an overly pessimistic timing analysis.

For example, suppose cell 312 is also in the same region as cell 308, namely, region 304. Moreover, suppose they are the same type of cells with the same size. During STA, these two cells—cell 308 and 312—can be assigned widely different delay values during the worst case analysis. But, due to their close physical proximity, the delay values for these cells are expected to be approximately the same.

The present invention remedies this problem by using location-aware on-chip variation. In one embodiment of the present invention, a derating factor can be composed of two types of parameters: (a) distance-independent parameters, or (b) distance-dependent parameters. Note that distance-independent parameters do not have a unit, while distance-dependent parameters are specified in per-unit-distance.

Furthermore, in one embodiment of the present invention, the derating factor can be a linear combination of a plurality of parameters. Specifically, the derating factor for a cell can be computed using the expression $$F = 1 + \sum_{i=1}^{n}(f_i - 1) + \sum_{j=1}^{m} d_j \times (f'_j - 1),$$

where F is the derating factor, $f_i$ is the $i^{th}$ distance-independent parameter, $d_j$ is the distance of the cell, and $f'_j$ is the $j^{th}$ distance-dependent parameter. Note that the distance of the cell $d_j$ can be computed in a number of ways. For example, in one embodiment of the present invention, the distance $d_j$ is computed in reference to a common point. In another embodiment of the present invention, the distance $d_j$ is computed in reference to another cell. Furthermore, the distance $d_j$ can represent the electrical distance, the topological distance, or the layout distance.

Figure 5:
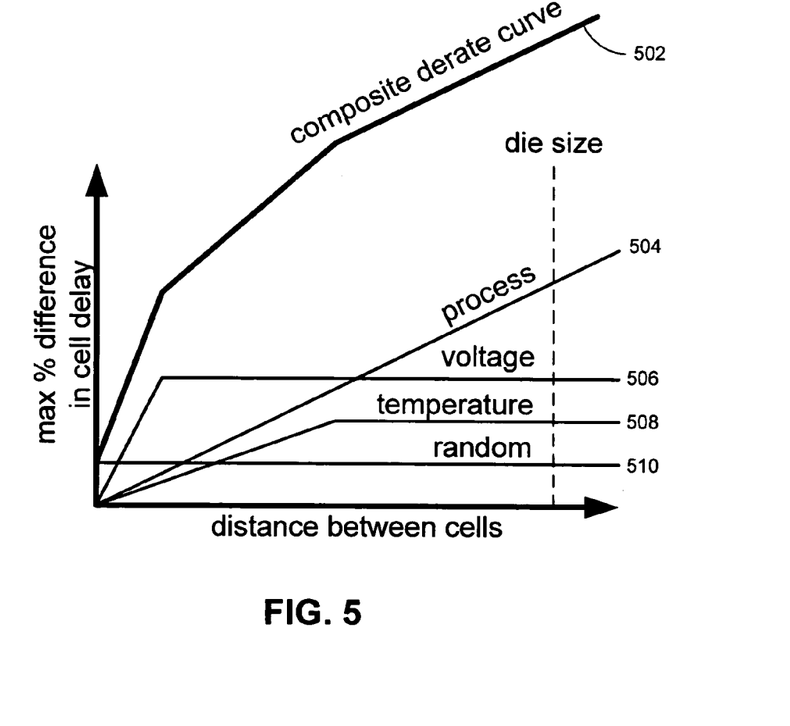
FIG. 5 presents a plot of a derating factor, which is composed of various distance-independent and distance-dependent parameters in accordance with an embodiment of the present invention.

FIG. 5 presents a plot of a derating factor, which is composed of various distance-independent and distance-dependent parameters in accordance with an embodiment of the present invention.

Composite derate curve 502, which plots the maximum percentage difference in cell delay against the distance between the cells, is a linear combination of four curves, namely, process curve 504, voltage curve 506, temperature curve 508, and random curve 510. Furthermore, note that the random parameter (which corresponds to the random curve 510) is a distance-independent parameter. On the other hand, the process parameter (which corresponds to the process curve 504), the voltage parameter 506 (which corresponds to the voltage curve 506), and the temperature curve 508 (which corresponds to the temperature curve 508) are all distance-dependent parameters.

Furthermore, in one embodiment of the present invention, a derating factor can be specified for a design, a library cell, a hierarchical cell, a leaf cell, or a net. For example, if a cell is in proximity of a hot bus, a larger derating factor can be specified for that particular cell. A derating factor can also be specific to a pin-to-pin arc or a metal layer.

Note that it is possible to have an instance for which multiple derating factors have been specified. For example, a derating factor can be specified for a net and another derating factor can be specified for the hierarchical net that contains the net. In one embodiment of the present invention, if multiple derating factors are applicable to an instance, a user-defined priority order can be used to select the highest priority derating factor. The highest priority derating factor can then be used in the STA computations.

In one embodiment of the present invention, the priority order (from highest to lowest) for cell derating factors can be: (a) instance, (b) hierarchical-cell, (c) library-cell, and (d) global (or design). Furthermore, the priority order (from highest to lowest) for net derating factors can be: (a) net, (b) hierarchical-net, and (c) global (or design).

Figure 6:
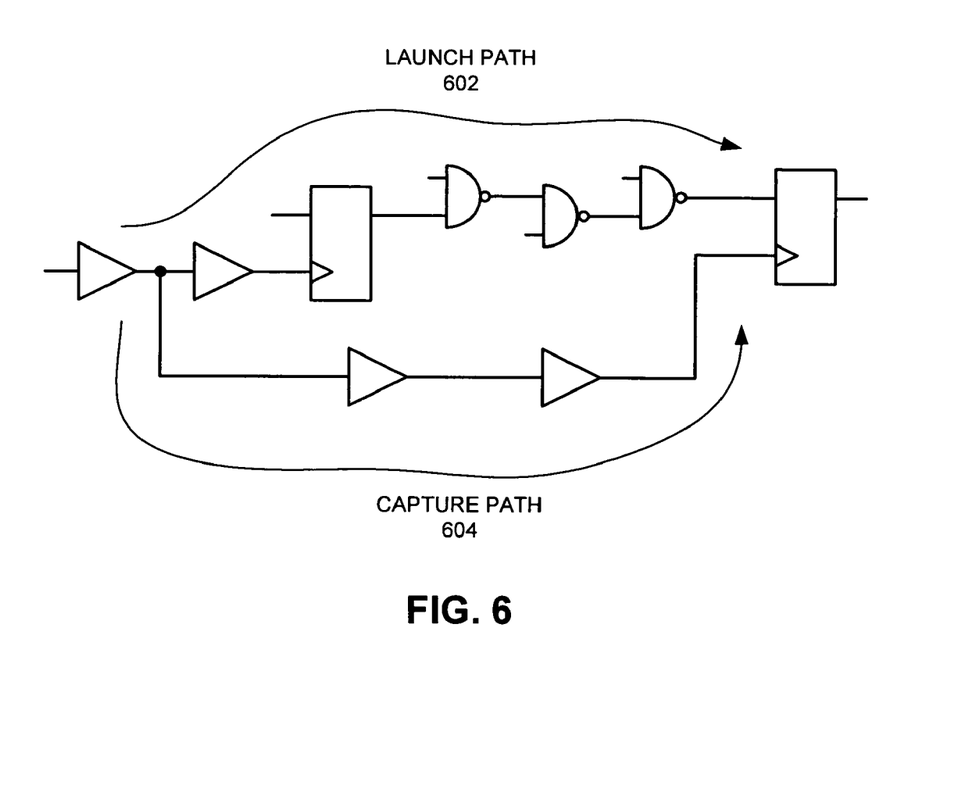
FIG. 6 illustrates a circuit schematic with a launch path and a capture path in accordance with an embodiment of the present invention.

FIG. 6 illustrates a circuit schematic with a launch path 602 and a capture path 604 in accordance with an embodiment of the present invention.

Note that the path delays on these two paths can be different. If the difference in the path delays is more than a threshold (called a setup or hold time), it can cause the circuit to malfunction. STA allows a circuit designer to identify all such violating paths in a circuit that may cause the circuit to malfunction.

Unfortunately, present STA techniques consider the worst-case scenario while computing the delay difference due to on-chip variation. For example, suppose the delay of capture path 604 is more than the delay of the launch path 602. If the on-chip variation is ±10%, present STA techniques typically compute the worst case scenario as follows: they reduce the path delay of the capture path 604 by 10% and increase the path delay of the launch path by 10%. As a result, the total difference in the path delays increases by 20%, which can cause the circuit to malfunction. Consequently, present STA techniques would report these paths as violating paths if the difference is more than the corresponding threshold.

Note that, in reality, these paths may physically be next to one another, and hence it may be impossible for one path to have a +10% variation while the other to have a −10% variation. The present invention computes a set of static derate values that safely bound the analysis in a more realistic manner.

In one embodiment of the present invention, the on-chip variation is computed using distance-dependent derating factors, thereby taking into account the paths' physical proximity or lack thereof. Note that the distance of a cell on a path can be computed using various techniques. For example, the distance of a cell can be the electrical distance (which is computed by adding the propagation delays), the topological distance (which is computed by counting the number of cells, nets or stages), or the layout distance (which is computed by finding the Euclidean distance).

Specifically, in one embodiment of the present invention, the layout distance of a cell is computed by determining the Euclidean distance of the cell from a set of reference cells.

In another embodiment of the present invention, the layout distance of a cell is computed by determining the Euclidean distance of the cell from a reference point.

Note that the distance between two cells can be computed by finding the Euclidean distance between a point in the first cell and a point in the second cell. In one embodiment of the present invention, the distance between two cells is equal to the distance between the centers of the two cells.

In one embodiment of the present invention, the layout distance of a cell in a group of cells is determined by finding the length of a diagonal of a bounding box that encloses the group of cells. Specifically, in one embodiment of the present invention, the bounding box encloses the launch and capture paths that are being analyzed.

Figure 7:
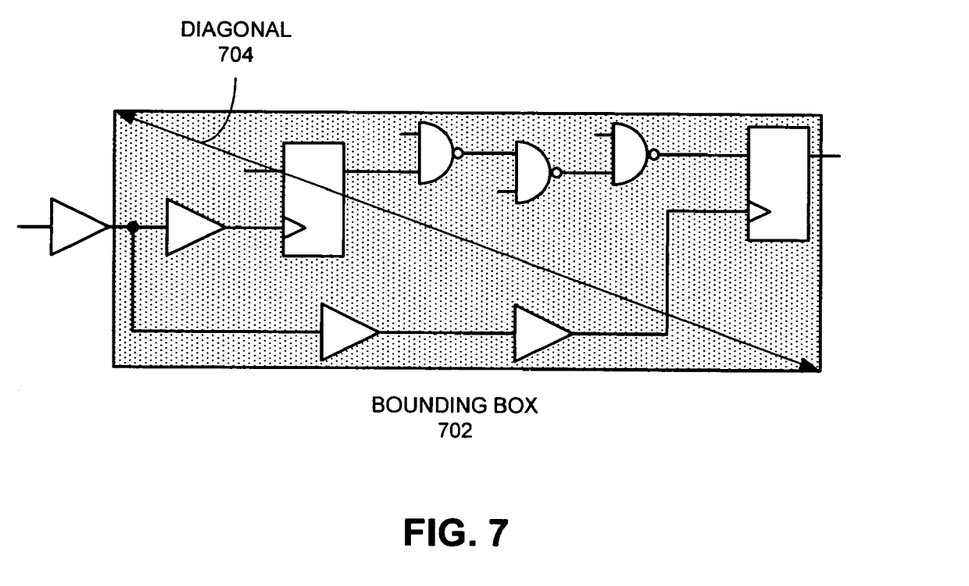
FIG. 7 illustrates a diagonal of a bounding box that encloses a group of cells in accordance with an embodiment of the present invention.

FIG. 7 illustrates a diagonal 704 of a bounding box 702 that encloses a group of cells in accordance with an embodiment of the present invention. In another embodiment of the present invention, the cell common to the launching and capturing paths in FIG. 7 is included in the bounding box.

Note that the Euclidean distance between any two cells within the bounding box is less than the length of the diagonal 704 of the bounding box 702. Furthermore, using the length of the diagonal 704 to compute the on-chip variation is more conservative than finding the Euclidean distances between every pair of cells in the group of cells. Consequently, the set of violating paths found using the bounding box are a superset of the set of violating paths found using the Euclidean distances between every pair of cells.

In one embodiment of the present invention, the on-chip-variation can be computed by multiple distance metrics. For example, the variation magnitude can be proportional to the layout distance. But, the variation magnitude could be lower due to cancellation effects if the path's topological distance is long. Such complex or customized computation styles are handled by allowing the path-specific derating factors to be computed by a user-supplied subroutine such as a Tcl script.

Furthermore, computing the Euclidean distances between every pair of cells requires $O(n^2)$ computation time, where n is the number of cells. On the other hand, using a bounding box to compute the set of violating paths requires less computation.

Note that, the amount of derate that is applied to a cell depends on the specific set of paths being analyzed.

Figure 8:
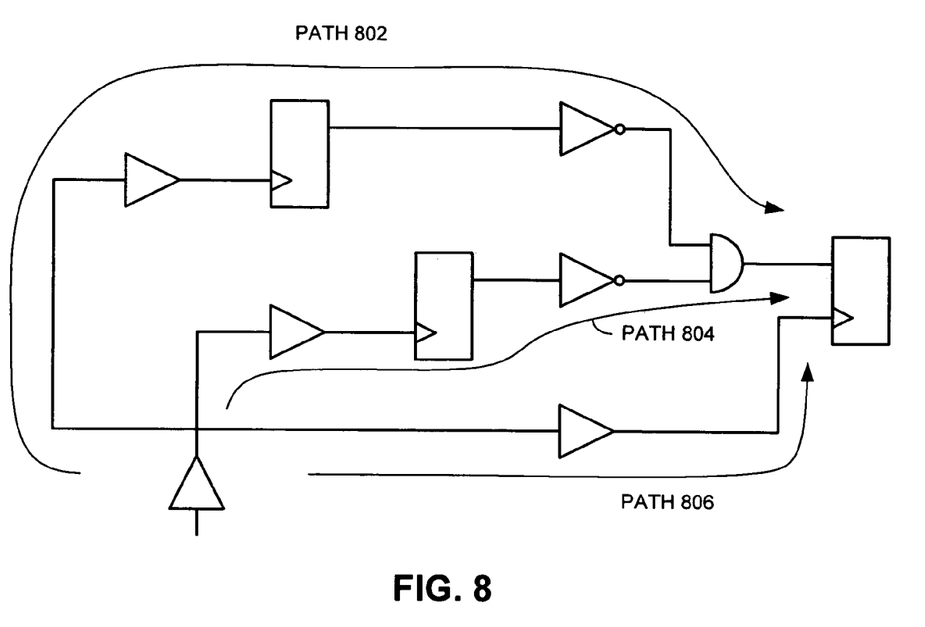
FIG. 8 illustrates a circuit schematic with three paths in accordance with an embodiment of the present invention.

FIG. 8 illustrates a circuit schematic with three paths, namely, path 802, 804, and 806, in accordance with an embodiment of the present invention. Suppose that path 806 is physically closer to path 804 than path 802. Consequently, the on-chip variation between paths 802 and 806 is expected to be larger than the on-chip variation between paths 804 and 806. Accordingly, different derating factors can be used for the cells in path 806 depending on the paths that are being compared.

For example, in one embodiment of the present invention, a derating factor of 10% can be applied to the cells in path 806 while comparing paths 802 and 806. On the other hand, a derating factor of 5% can be applied to the cells in path 806 while comparing paths 804 and 806.

Note that it is computationally infeasible to perform STA by enumerating each path and computing a path-specific derating factor based on each pair of paths. Hence, the present invention first computes a set of worst-case violating paths, and then computes the path-specific derating factors for one or more paths in the set of worst-case violating paths.

Process for Reducing Timing Pessimism During STA

Figure 9:
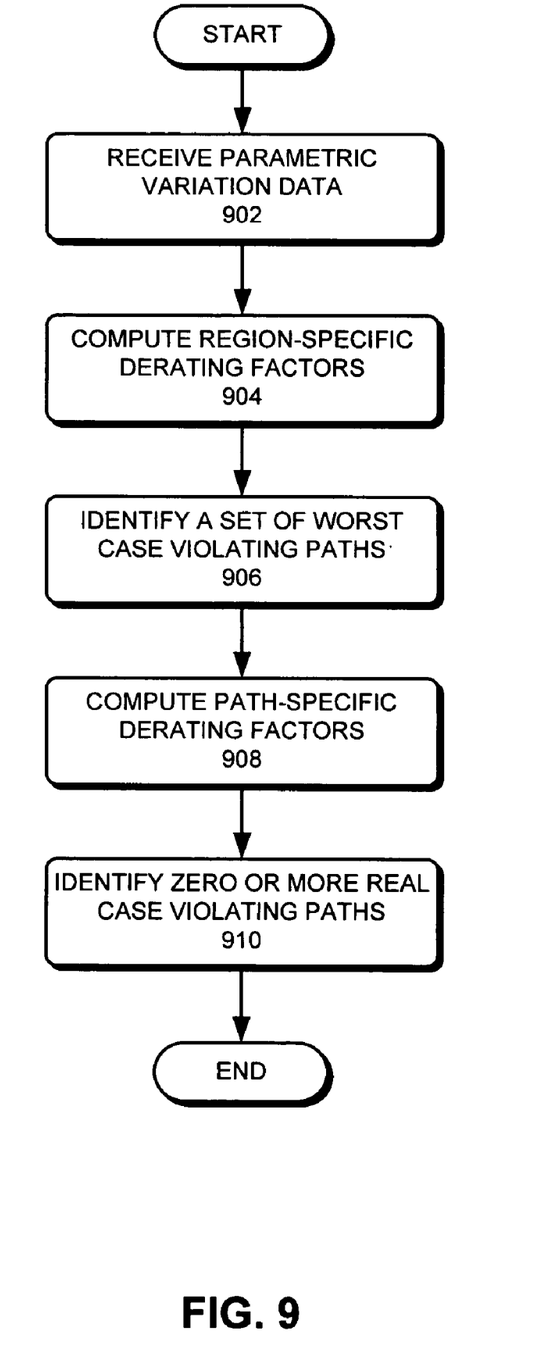
FIG. 9 presents a flowchart that illustrates the process of finding realistic-case violating paths, thereby reducing timing pessimism during STA in accordance with an embodiment of the present invention.

FIG. 9 presents a flowchart that illustrates the process of finding realistic-case violating paths, thereby reducing timing pessimism during STA in accordance with an embodiment of the present invention.

The process begins with receiving parametric variation data (step 902). Recall that the parametric variation data can have both distance-independent and distance-dependent parameters. Moreover, recall that the parametric variation data can be specified for a particular instance, such as, a library cell, a hierarchical cell, a leaf cell, or a net. Furthermore, the parametric variation data can also be specified for a particular pin-to-pin arc or a particular metal layer. In addition, the parametric variation data can be given using a file input or a command-line input.

Next, the system computes a set of region-specific derating factors using the parametric variation data (step 904). In one embodiment of the present invention, a region can encompass the whole chip. In this case, the region-specific derating factor is essentially a global derating factor.

The system then identifies a set of worst-case violating paths (step 906). Note that the system uses the region-specific derating factors to compute the set of worst-case violating paths. Furthermore, note that computing a set of worst-case violating paths using region-specific derating factors is computationally less expensive than directly computing a set of realistic-case violating paths using path-specific derating factors.

Next, the system computes path-specific derating factors for one or more paths in the set of worst-case violating paths (step 908). In one embodiment of the present invention, the system receives a set of user-specified instructions. Next, the system computes the path-specific derating factors using the user-specified instructions. Furthermore, in another embodiment of the present invention, the system computes the path-specific derating factors by calling an external subroutine provided by the user.

Finally, the system identifies zero or more realistic-case violating paths from the set of worst-case violating paths using the path-specific derating factors (step 910). In one embodiment of the present invention, the system identifies zero or more realistic-case violating paths from the set of worst-case violating paths using the path-specific derating factors and using the properties of the violating paths, e.g., distances between their cells, path lengths, etc.

In one embodiment of the present invention, the system identifies the realistic-case violating paths one at a time on a single processing unit. In another embodiment of the present invention, the system identifies the realistic-case violating paths in parallel on a single processing unit. In yet another embodiment of the present invention, the system identifies the realistic-case violating paths in parallel on a set of processing units.

Note that the system reduces the timing pessimism because the method identifies violating paths using the fine-grained path-specific derating factors instead of the coarse-grained region-specific derating factors. Furthermore, note that the system saves computational time by first identifying a set of worst-case violating paths and then identifying the realistic-case violating paths from the set of worst-case violating paths, instead of directly identifying the realistic-case violating paths from the set of all possible paths.

CONCLUSION

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

Furthermore, the data structures and code described in this detailed description are typically stored on a computer-readable storage medium, which may be any type of device or medium that can store code and/or data for use by a computer system. This includes, but is not limited to, magnetic and optical storage devices such as disk drives, magnetic tape, CDs (compact discs) and DVDs (digital versatile discs or digital video discs).

What is claimed is:

1. A method for identifying realistic-case violating paths in a computationally efficient manner, the method comprising:
   receiving parametric variation data which describes the variation of timing-related parameters over a chip, wherein using path-specific derating factors to directly identify realistic-case violating paths in the set of all paths in the chip is computationally infeasible;
   computing region-specific derating factors using the parametric variation data;
   identifying a set of worst-case violating paths using the region-specific derating factors, thereby automatically identifying paths that are of interest for reducing timing pessimism;
   computing path-specific derating factors for the set of worst-case violating paths using the parametric variation data, wherein the path-specific derating factors include distance-dependent components; and
   identifying realistic-case violating paths in the set of worst-case violating paths using the path-specific derating factors, wherein using the path-specific derating factors to identify realistic-case violating paths in the set of worst-case violating paths is computationally feasible;
   wherein the method reduces the timing pessimism because the method identifies realistic-case violating paths using the fine-grained path-specific derating factors instead of only identifying worst-case violating paths using the coarse-grained region-specific derating factors.

2. The method of claim 1, wherein a parameter in the parametric variation data can be:
   a distance-independent parameter; or
   a distance-dependent parameter.

3. The method of claim 1, wherein computing region-specific derating factors involves computing a global derating factor.

4. The method of claim 1, wherein computing path-specific derating factors involves identifying a reference-path, which is used as a reference while computing the delays for other paths.

5. The method of claim 1, wherein computing path-specific derating factors involves:
   receiving a set of user-specified instructions; and
   computing the path-specific derating factors using the set of user-specified instructions.

6. The method of claim 1, wherein computing path-specific derating factors involves calling an external subroutine provided by the user.

7. The method of claim 1, wherein computing path-specific derating factors involves computing a bounding box, which encloses the launch and capture paths that are being analyzed.

8. The method of claim 1, wherein computing path-specific derating factors involves computing a distance between two cells within the chip, wherein the distance can be computed using an electrical distance, a topological distance, or a layout distance.

9. The method of claim 1, wherein identifying zero or more realistic-case violating paths can involve:
   identifying the realistic-case violating paths one at a time on a first processing unit;
   identifying the realistic-case violating paths in parallel on a second processing unit; or
   identifying the realistic-case violating paths in parallel on a set of processing units.

10. A computer-readable storage medium storing instructions that when executed by a computer cause the computer to perform a method for identifying realistic-case violating paths in a computationally efficient manner, the method comprising:
   receiving parametric variation data which describes the variation of timing-related parameters over a chip, wherein using path-specific derating factors to directly identify realistic-case violating paths in the set of all paths in the chip is computationally infeasible;
   computing region-specific derating factors using the parametric variation data;
   identifying a set of worst-case violating paths using the region-specific derating factors, thereby automatically identifying paths that are of interest for reducing timing pessimism;
   computing path-specific derating factors for the set of worst-case violating paths using the parametric variation data, wherein the path-specific derating factors include distance-dependent components; and
   identifying realistic-case violating paths in the set of worst-case violating paths using the path-specific derating factors, wherein using the path-specific derating factors to identify realistic-case violating paths in the set of worst-case violating paths is computationally feasible;
   wherein the method reduces the timing pessimism because the method identifies realistic-case violating paths using the fine-grained path-specific derating factors instead of only identifying worst-case violating paths using the coarse-grained region-specific derating factors.

11. The computer-readable storage medium of claim 10, wherein a parameter in the parametric variation data can be:
   a distance-independent parameter; or
   a distance-dependent parameter.

12. The computer-readable storage medium of claim 10, wherein computing region-specific derating factors involves computing a global derating factor.

13. The computer-readable storage medium of claim 10, wherein computing path-specific derating factors involves identifying a reference-path, which is used as a reference while computing the delays for other paths.

14. The computer-readable storage medium of claim 10, wherein computing path-specific derating factors involves:
   receiving a set of user-specified instructions; and
   computing the path-specific derating factors using the set of user-specified instructions.

15. The computer-readable storage medium of claim 10, wherein computing path-specific derating factors involves calling an external subroutine provided by the user.

16. The computer-readable storage medium of claim 10, wherein computing path-specific derating factors involves computing a bounding box, which encloses the launch and capture paths that are being analyzed.

17. The computer-readable storage medium of claim 10, wherein computing path-specific derating factors involves computing a distance between two cells within the chip, wherein the distance can be computed using an electrical distance, a topological distance, or a layout distance.

18. The computer-readable storage medium of claim 10, wherein identifying zero or more realistic-case violating paths can involve:
   identifying the realistic-case violating paths one at a time on a single processing unit;
   identifying the realistic-case violating paths in parallel on a single processing unit; or
   identifying the realistic-case violating paths in parallel on multiple processing units.

19. An apparatus for identifying realistic-case violating paths in a computationally efficient manner, the apparatus comprising:
   a receiving mechanism configured to receive parametric variation data which describes the variation of timing-related parameters over a chip, wherein using path-specific derating factors to directly identify realistic-case violating paths in the set of all paths in the chip is computationally infeasible;
   a region-specific computing mechanism configured to compute region-specific derating factors using the parametric variation data;
   a worst-case identifying mechanism configured to identify a set of worst-case violating paths using the region-specific derating factors, thereby automatically identifying paths that are of interest for reducing timing pessimism;
   a path-specific computing mechanism configured to compute path-specific derating factors for the set of worst-case violating paths using the parametric variation data, wherein the path-specific derating factors include distance-dependent components; and
   a realistic-case identifying mechanism configured to identify realistic-case violating paths in the set of worst-case violating paths using the path-specific derating factors, wherein using the path-specific derating factors to identify realistic-case violating paths in the set of worst-case violating paths is computationally feasible;
   wherein the apparatus reduces the timing pessimism because the apparatus identifies realistic-case violating paths using the fine-grained path-specific derating factors instead of only identifying worst-case violating paths using the coarse-grained region-specific derating factors.

20. The apparatus of claim 19, wherein a parameter in the parametric variation data can be:
   a distance-independent parameter; or
   a distance-dependent parameter.

21. The apparatus of claim 19, wherein the region-specific computing mechanism is further configured to compute a global derating factor.

22. The apparatus of claim 19, wherein the path-specific computing mechanism is configured to identify a reference-path, which is used as a reference while computing the delays forother paths.

23. The apparatus of claim 19, wherein the path-specific computing mechanism further comprises:
   a instruction-receiving mechanism configured to receive a set of user-specified instructions; and
   a second path-specific computing mechanism configured to compute the path-specific derating factors using the set of user-specified instructions.

24. The apparatus of claim 19, the path-specific computing mechanism is further configured to call an external subroutine provided by the user.

25. The apparatus of claim 19, wherein the path-specific computing mechanism is configured to compute a bounding box, which encloses launch and capture the paths that are being analyzed.

26. The apparatus of claim 19, wherein the path-specific computing mechanism is further configured to compute a distance between two cells within the chip using an electrical distance, a topological distance, or a layout distance.

27. The apparatus of claim 19, wherein the realistic-case identifying mechanism can include:
   a first processing-unit configured to identify the realistic-case violating paths one at a time;
   a second processing-unit configured to identify the realistic-case violating paths in parallel; or
   a set of processing units configured to identify the realistic-case violating paths in parallel.

* * * * *

UNITED STATES PATENT AND TRADEMARK OFFICE
CERTIFICATE OF CORRECTION

| | | |
|---|---|---|
| PATENT NO. | : 7,237,212 B2 | Page 1 of 1 |
| APPLICATION NO. | : 10/972899 | |
| DATED | : June 26, 2007 | |
| INVENTOR(S) | : Kayhan Küçükçakar et al. | |

It is certified that error appears in the above-identified patent and that said Letters Patent is hereby corrected as shown below:

In claim 22 (at column 11, line 4), please delete the word, "forother" and replace with the word --for other--.

Signed and Sealed this

Fourteenth Day of August, 2007

JON W. DUDAS
*Director of the United States Patent and Trademark Office*